United States Patent
Shi

(10) Patent No.: US 10,522,607 B2
(45) Date of Patent: Dec. 31, 2019

(54) OLED DISPLAY PANEL AND OLED DISPLAY APPARATUS

(71) Applicant: Shenzhen China Star Optoelectronics Semiconductor Display Technology Co., Ltd., Shenzhen, Guangdong (CN)

(72) Inventor: Longqiang Shi, Guangdong (CN)

(73) Assignee: Shenzhen China Star Optoelectronics Semiconductor Display Technology Co., Ltd, Shenzhen, Guangdong (CN)

(*) Notice: Subject to any disclaimer, the term of this patent is extended or adjusted under 35 U.S.C. 154(b) by 0 days.

(21) Appl. No.: 15/557,100

(22) PCT Filed: Aug. 22, 2017

(86) PCT No.: PCT/CN2017/098443
§ 371 (c)(1),
(2) Date: Sep. 9, 2017

(87) PCT Pub. No.: WO2019/010759
PCT Pub. Date: Jan. 17, 2019

(65) Prior Publication Data
US 2019/0019854 A1 Jan. 17, 2019

(30) Foreign Application Priority Data

Jul. 11, 2017 (CN) .......................... 2017 1 0561070

(51) Int. Cl.
*H01L 27/32* (2006.01)
*H01L 51/52* (2006.01)
*H01L 51/00* (2006.01)

(52) U.S. Cl.
CPC ...... *H01L 27/3276* (2013.01); *H01L 27/3262* (2013.01); *H01L 51/0024* (2013.01); *H01L 51/5221* (2013.01); *H01L 51/5225* (2013.01)

(58) Field of Classification Search
CPC . H01L 51/50; H01L 51/5225; H01L 27/3276; H01L 27/3262
(Continued)

(56) References Cited

U.S. PATENT DOCUMENTS 7,586,259 B2 * 9/2009 Kwak ................. H01L 27/3276
                                                    313/506
10,139,945 B2    11/2018 Lu et al.
(Continued)

FOREIGN PATENT DOCUMENTS

CN        101192372 A      6/2008
CN        103927070 A      7/2014
(Continued)

*Primary Examiner* — Long K Tran
(74) *Attorney, Agent, or Firm* — Andrew C. Cheng

(57) ABSTRACT

An OLED display panel and an OLED display apparatus are provided. The OLED display panel includes an array substrate and a cathode plate disposed corresponding to the array substrate. Multiple cathode strips are disposed in parallel on the cathode plate. Each cathode strip is corresponding to a row of pixel regions of the array substrate and used as cathodes of light-emitting units in the row of pixel regions. Multiple cathode switching elements are disposed on the array substrate, a control terminal of each cathode switching element is electrically connected to one corresponding scan line, a first passage terminal of the cathode switching element is connected to a low voltage direct current power supply, and a second passage terminal of the cathode switching element is connected to one corresponding cathode strip. By the above means, the invention can reduce the cathode resistance.

17 Claims, 3 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2007/0170839 | A1* | 7/2007 | Choi | C03C 8/24 |
| | | | | 313/500 |
| 2007/0194304 | A1* | 8/2007 | Zu | H01L 51/5246 |
| | | | | 257/40 |
| 2011/0042487 | A1* | 2/2011 | Cai | A01G 25/145 |
| | | | | 239/332 |
| 2011/0043487 | A1* | 2/2011 | Huang | G06F 3/0412 |
| | | | | 345/175 |
| 2013/0234115 | A1* | 9/2013 | Song | H01L 51/56 |
| | | | | 257/40 |

FOREIGN PATENT DOCUMENTS

| | | |
|---|---|---|
| CN | 104900677 A | 9/2015 |
| CN | 104932110 A | 9/2015 |
| CN | 106292052 A | 1/2017 |
| CN | 106449726 A | 4/2017 |
| CN | 106935724 A | 7/2017 |

* cited by examiner

OLED DISPLAY PANEL AND OLED DISPLAY APPARATUS

TECHNICAL FIELD

The invention relates to the field of display technology, and particularly to an OLED display panel and an OLED display apparatus.

DESCRIPTION OF RELATED ART

The OLED (Organic Light Emitting Diode) has advantages such as self-emissive, low power consumption, fast response speed, high contrast and wide viewing angle, and thus the OLED has a wide range of application scenarios in the field of display technology.

Referring to FIG. 1, FIG. 1 is a structural schematic view of an embodiment of a conventional OLED display panel. The OLED display panel includes an array substrate 10 and a cathode 12. The cathode 12 generally is a one-piece planar electrode disposed corresponding to the array substrate 10. A cathode voltage signal VSS provided from a low voltage DC supply power sequentially passes through the array substrate 10 and an electrically conductive material 14 to the cathode 12, and thereby the cathode 12 obtains a corresponding cathodic potential.

The inventor(s) of the invention in a long-term research and development process has/have found that because the cathode 12 is a one-piece block electrode, resistance of the cathode 12 is excessively high, which would increase a voltage drop (IR drop) of the OLED, degrade display brightness of the OLED and even affect normal display of the OLED in a serious case.

SUMMARY

A technical problem primarily to be solved by the invention is to provide an OLED display panel and an OLED display apparatus.

In order to solve the above technical problem, a technical solution proposed by the invention is to provide an OLED display panel. The OLED display panel includes: an array substrate including multiple scan lines and multiple data lines, the scan lines being intersected with the data lines to divide the array substrate into multiple pixel regions, and each of the pixel regions having a corresponding OLED light-emitting unit disposed therein; and a cathode plate, being disposed corresponding to the array substrate and including a transparent substrate and multiple cathode strips in parallel arranged at a side of the transparent substrate facing toward the array substrate. Each of the cathode strips is corresponding to a row of pixel regions of the array substrate and used as cathodes of OLED light-emitting units in the row of pixel regions. The array substrate has multiple cathode switching elements disposed thereon and the cathode switching elements are thin film transistors. For each of the cathode switching elements, a control terminal is electrically connected to a corresponding one of the scan lines, a first passage terminal is connected to a low voltage direct current power supply, and a second passage terminal is connected to a corresponding one of the cathode strips. When the corresponding one scan line is scanned, the corresponding cathode switching element is turned on to deliver a cathode voltage provided by the low voltage direct current power supply to the corresponding cathode strip, so that OLED light-emitting units in the row of pixel regions corresponding to the cathode strip normally work.

In order to solve the above technical problem, another technical solution proposed by the invention is to provide an OLED display panel. The OLED display panel includes: an array substrate including multiple scan lines and multiple data lines, the scan lines being intersected with the data lines to divide the array substrate into multiple pixel regions, and each of the pixel regions having a corresponding OLED light-emitting unit disposed therein; and a cathode plate disposed corresponding to the array substrate, the cathode plate having multiple cathode strips in parallel disposed thereon. Each of the cathode strips is corresponding to a row of pixel regions of the array substrate and used as cathodes of OLED light-emitting units in the row of pixel regions. The array substrate has multiple cathode switching elements disposed thereon. For each cathode switching element, a control terminal is electrically connected to a corresponding one of the scan lines, a first passage terminal is connected to a low voltage direct current power supply, and a second passage terminal is connected to a corresponding one of the cathode strips. When the corresponding one scan line is scanned, the corresponding cathode switching element is turned on to deliver a cathode voltage provided by the low voltage direct current power supply to the corresponding cathode strip, so that OLED light-emitting units in the row of pixel regions corresponding to the cathode strip normally work.

In order to solve the above technical problem, still another technical solution proposed by the invention is to provide an OLED display apparatus. The OLED display apparatus includes the OLED display panel as described in any one of the above embodiments.

Efficacy can be achieved by the invention is that different from the prior art, the OLED display panel provided by the invention includes an array substrate and a cathode plate. The cathode plate is disposed overlying the array substrate, and the cathode plate has multiple cathode strips in parallel disposed thereon. Each of the cathode strips is corresponding to a row of pixel regions of the array substrate and used as cathodes of OLED light-emitting units in the row of pixel regions. The array substrate further has multiple cathode switching elements disposed thereon. For each of the cathode switching elements, a control terminal is electrically connected to a corresponding one of the scan lines, a first passage terminal is connected to a low voltage direct current power supply, and a second passage terminal is connected to a corresponding one of the cathode strips. The OLED display panel provided by the invention, when it is at work, the scan lines are progressively turned on, when the scan line corresponding to the cathode strip is scanned, the corresponding cathode switching element is turned on to deliver a cathode voltage provided by the low voltage direct current power supply to the corresponding cathode strip, so that OLED light-emitting units in the row of pixel regions corresponding to the cathode strip normally work. At a certain moment, when a certain one scan line is turned on, only one cathode strip corresponding to OLED light-emitting units in the row of pixel regions corresponding to the scan line can obtain the cathode voltage, and therefore it can greatly reduce the resistance of cathode, reduce the IR drop caused by the resistance of cathode and improve display effect of the OLED consequently.

BRIEF DESCRIPTION OF THE DRAWINGS

In order to more clearly illustrate technical solutions of embodiments of the invention, drawings will be used in the description of the embodiments of the invention will be given a brief description below. Apparently, the drawings in the following description only are some of embodiments of the invention, the ordinary skill in the art can obtain other drawings according to these illustrated drawings without creative effort. In which.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
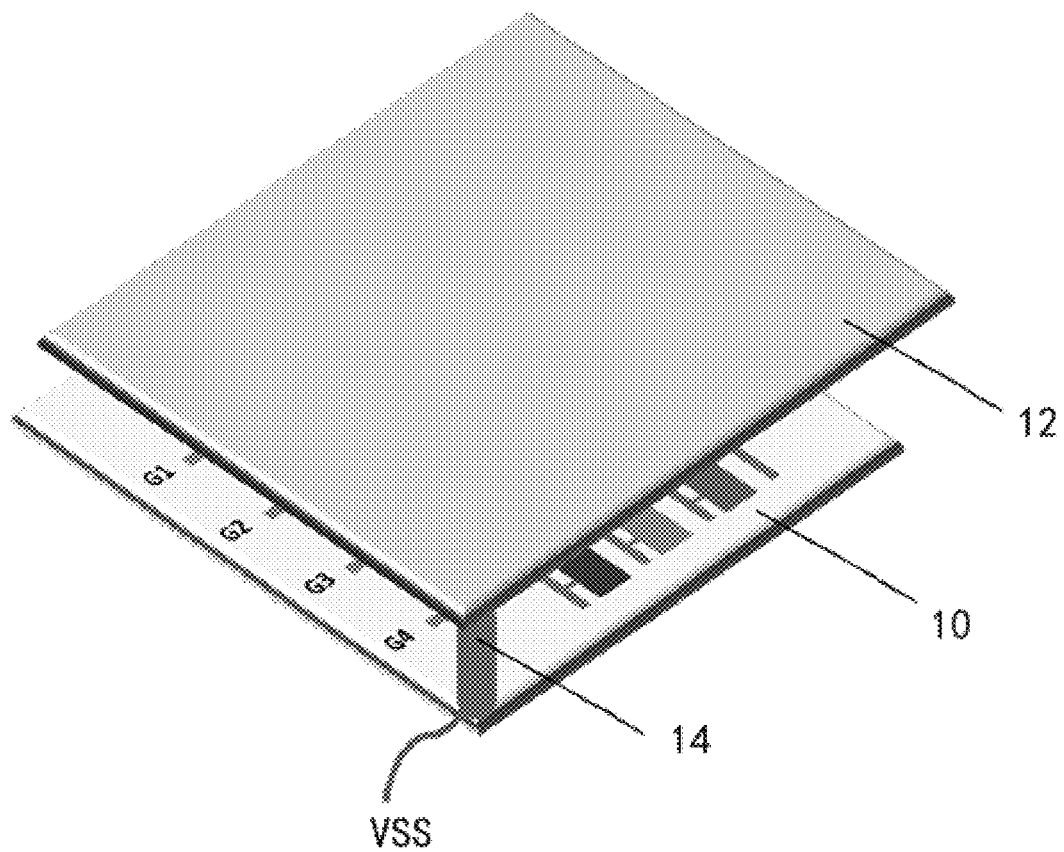
FIG. 1 is a structural schematic view of an embodiment of a conventional OLED display panel.
Figure 2:
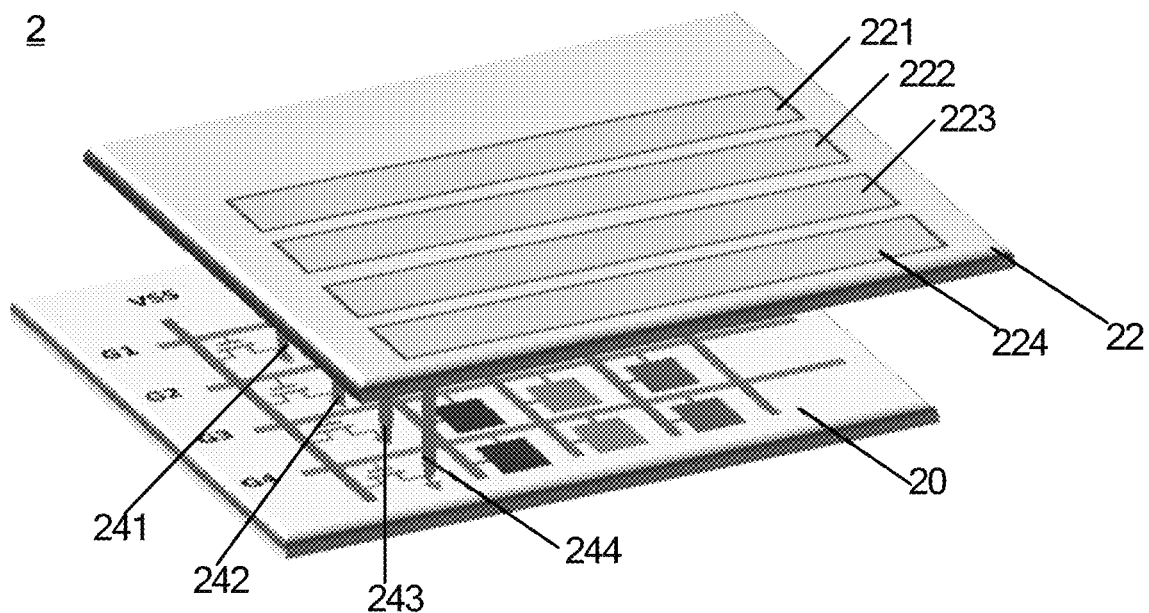
FIG. 2 is a structural schematic view of an embodiment of an OLED display panel according to the invention.

Referring to FIG. 2, which is a structural schematic view of an embodiment of an OLED display panel according to the invention. The display panel 2 includes an array substrate 20 and a cathode plate 22. The cathode plate 22 is disposed overlying the array substrate 20.

Figure 3:
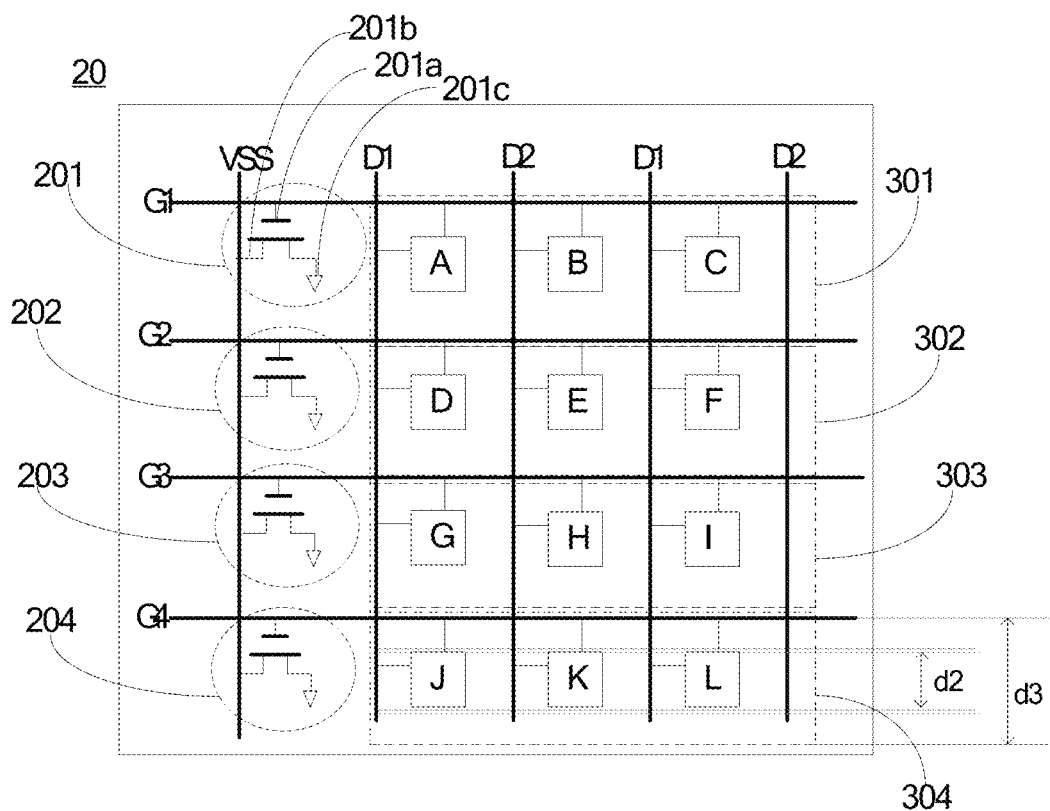
FIG. 3 is a structural schematic view of an embodiment of an array substrate in FIG. 2.

Specifically, referring to FIG. 3, which is a structural schematic view of an embodiment of the array substrate in FIG. 3. The array substrate 20 includes multiple (i.e., more than one) scan lines G1, G2, G3, G4 and multiple data lines D1, D2, D3, D4. FIG. 3 only show four scan lines and four data lines for the purpose of illustration; in other embodiment, the numbers of the scan lines and the data lines may be other numbers and the invention is not limited thereto. The scan lines G1, G2, G3, G4 are mutually intersected with the data lines D1, D2, D3, D4 to divide the array substrate 20 into multiple pixel regions. Each of the pixel regions has corresponding one of OLED light-emitting units A, B, C, D, E, F, G, H, I, J, K, L disposed therein.

Figure 4:
FIG. 4 is a structural schematic view of an embodiment of a cathode plate in FIG. 2.

Referring to FIG. 4, which is a structural schematic view of an embodiment of the cathode plate in FIG. 2. The cathode plate 22 has multiple parallel cathode strips 221, 222, 223, 224 disposed thereon. In an embodiment, a material of the cathode strips 221, 222, 223, 224 is a metal (such as copper, aluminum, etc.) or a conductive non-metal (such as indium tin oxide (ITO), graphite, etc.). In another embodiment, the cathode plate 22 further includes a transparent substrate 220 for supporting the cathode strips 221, 222, 223, 224. A material of the transparent substrate 220 is a non-conductive transparent material (such as glass, etc.). The cathode strips 221, 222, 223, 224 are disposed at a side of the transparent substrate 220 facing toward the array substrate 20. Each of the cathode strips 221, 222, 223, 224 is corresponding to one row of pixel regions on the array substrate 20 and used as cathodes of OLED light-emitting units in the row of pixel regions. In an application scenario, lengthwise directions of the cathode strips 221, 222, 223, 224 respectively are the same as directions (i.e., lengthwise directions) of corresponding scan lines G1, G2, G3, G4. For example, in the illustrated embodiment, the cathode strip 221 is corresponding to the row of pixel regions 301 of the array substrate 20, and the lengthwise direction of the cathode strip 221 is the same as the direction of the scan line G1 corresponding to the row of pixel regions 301; the cathode strip 222 is corresponding to the row of pixel regions 302 of the array substrate 20, and the lengthwise direction of the cathode strip 222 is the same as the direction of the scan line G2 corresponding to the row of pixel regions 302; the cathode strip 223 is corresponding to the row of pixel regions 303 of the array substrate 20, and the lengthwise direction of the cathode strip 223 is the same of the direction of the scan line G3 corresponding to the row of pixel regions 303; the cathode strip 224 is corresponding to the row of pixel regions 304 of the array substrate 20, and the lengthwise direction of the cathode strip 224 is the same as the direction of the scan line G4 corresponding to the row of pixel regions 304. In order to ensure light-emitting effect of the OLED light-emitting units in the pixel regions, a width of each of the cathode strips 221, 222, 223, 224 is greater than or equal to a width of one corresponding row of OLED light-emitting units. When the cathode strip 224 is taken as an example, its width d1 is greater than or equal to the width d2 of the OLED light-emitting units J, K, L in the corresponding row of pixel regions 304. In another application scenario, because the cathode strips 221, 222, 223, 224 need to be electrically insulated from one another, the cathode strip 224 still is taken as an example, when the width d1 of the cathode strip 224 is greater than or equal to the width d2 of the corresponding one row of OLED light-emitting units J, K, L, the width d1 of the cathode strip 224 further ought to be smaller than the width d3 of the row of pixel regions 304 corresponding thereto, i.e., $d2 \leq d1 < d3$.

In order to ensure electrical connection between the array substrate 20 and the cathode plate 22, the array substrate 20 further has multiple cathode switching elements 201, 202, 203, 204 disposed thereon. When one cathode switching element 201 is taken as an example, a control terminal 201a of the cathode switching element 201 is electrically connected to the corresponding scan line G1, a first passage terminal 201b thereof is connected to a low voltage direct current (DC) power supply, and a second passage terminal 201c thereof is electrically connect to the corresponding cathode strip 221. When the scan line G1 corresponding to the cathode strip 221 is scanned, i.e., the control terminal 201a of the corresponding cathode switching element 201 is inputted with a pulse voltage, the corresponding cathode switching element 201 is turned on, the turned on cathode switching element 201 delivers a cathode voltage supplied by the low voltage DC power supply to the corresponding cathode strip 221, the OLED light-emitting units A, B, C in the row of pixel regions 301 corresponding to the cathode strip 221 normally work. The other cathode switching elements 202, 203, 204 are similar to the above cathode switching element 201, and thus will not be repeated. Because during the OLED display panel 2 proposed by the invention is working, the scan lines G1, G2, G3, G4 are progressively scanned, at a certain moment, one of the scan lines (e.g., the scan line G1) is scanned, only one cathode strip (e.g., the cathode strip 221) corresponding to the OLED light-emitting units (e.g., the OLED light-emitting units A, B, C) in one row of pixel regions (e.g., the row of pixel regions 301) corresponding to the scanned scan line G1 can obtain the cathode voltage, such means would greatly reduce the resistance of cathode, reduce the IR drop caused by the resistance of cathode, and display effect of the OLED is improved consequently. In an application scenario, the cathode switching elements 201, 202, 203, 204 are thin film transistors, and they may be N-type thin film transistors or P-type thin film transistors. In another application scenario, the second passage terminals of the cathode switching elements 201, 202, 203, 204 each are a signal transfer probe point, and a material of the signal transfer probe point is metal.

In another embodiment, still referring to FIG. 2, the display panel 2 proposed by the invention further includes multiple electrically conductive connecting posts 241, 242, 243, 244 disposed between the array substrate 20 and the cathode plate 22. Each cathode strip 221, 222, 223 or 224 is connected to the second passage terminal of one corresponding cathode switching element 201, 202, 203 or 204 by one corresponding electrically conductive connecting post 241, 242, 243 or 244. In an application scenario, a material of the electrically conductive connecting posts 241, 242, 243, 244 is an electrically conductive metal or an electrically conductive non-metal. A shape of the electrically conductive connecting posts 241, 242, 243, 244 may be cylindrical, strip-shaped and so on, but the invention is not limited thereto.

In still another embodiment, still referring to FIG. 2 or FIG. 3, the display panel 2 proposed by the invention further includes a cathode signal line VSS disposed on the array substrate 20, and the cathode signal line VSS is externally connected to the low voltage DC power supply. The first passage terminal of each of the cathode switching elements 201, 202, 203, 204 is connected to the low voltage DC power supply by the cathode signal line VSS. In an application scenario, the cathode signal line VSS may be simultaneously formed in one same layer with the data lines D1, D2, D3, D4, or may be formed in different layers with respect to the data lines, but the invention is not limited thereto.

Figure 5:
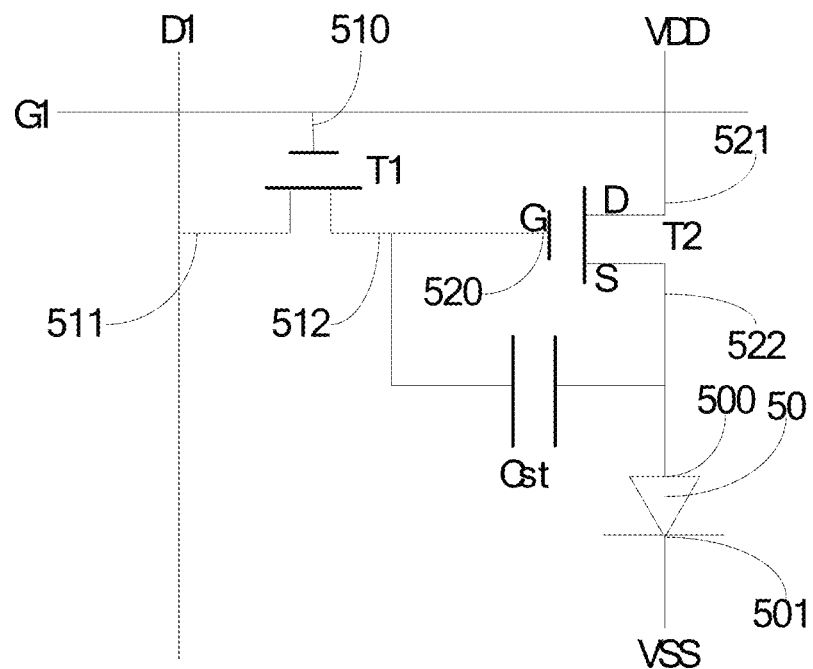
FIG. 5 is a schematic circuit diagram of an embodiment of a driving circuit of an OLED light-emitting unit in FIG. 2.

In the following, a working process of the OLED light-emitting unit in the OLED display panel is taken to further describe the invention. Referring to FIG. 5, which is a schematic circuit diagram of an embodiment of a driving circuit of an OLED light-emitting unit in FIG. 2. The pixel region corresponding to the OLED light-emitting unit A on the array substrate 20 is taken as an example for illustration, the pixel region includes: a first switching element T1, a second switching element T2, an OLED light-emitting unit 50 and a storage capacitor Cst. In an application scenario, the first switching element T1 and the second switching element T2 both are thin film transistors. Specifically, a control terminal 510 of the first switching element T1 is electrically connected to the corresponding san line G1, and a first passage terminal 511 thereof is electrically connected to the corresponding data line D1; a control terminal 520 of the second switching element T2 is electrically connected to a second passage terminal 512 of the first switching element T1, and a first passage terminal 521 thereof is connected to a high voltage DC power supply VDD; two terminals of the storage capacitor Cst respectively are connected to the control terminal 520 of the second switching element T2 and a second passage terminal 522 of the second switching element T2, an anode 500 of the OLED light-emitting unit 50 is electrically connected to the second passage terminal 522 of the second switching element T2, and the corresponding cathode strip 221 of the cathode plate 22 is used as the cathode 501 of the OLED light-emitting unit 50, i.e., the potential of the cathode 501 of the OLED light-emitting unit 50 is supplied by the corresponding cathode strip 221 of the cathode plate 22. In the above circuit structure, the second switching element T2 is a driving switching element for driving the OLED light-emitting unit 50 to emit light, and a driving current of the OLED light-emitting unit 50 is $I=k(Vgs-Vth)^2$, where k is a current amplification factor of the second switching element T2 and determined by the characteristics of the second switching element T2 itself, Vth is a threshold voltage of the second switching element T2, Vgs is a voltage difference between the control terminal 520 (i.e., gate electrode G) and the second passage terminal 522 (i.e., source electrode S) of the second switching element T2, i.e., Vgs=Vg-Vs. The cathode potential of the OLED light-emitting unit 50 in the display panel proposed by this application is supplied by one corresponding cathode strip 221 of the cathode plate 22, the resistance of the cathode strip 221 in this application is smaller than the resistance of one-piece cathode electrode in the prior art, and therefore a divided voltage of the cathode 501 of the OLED light-emitting unit 50 is reduced, the voltage Vs on the source electrode S of the second switching element T2 is reduced, the Vgs is increased, so that the driving current I of the OLED light-emitting unit 50 is increased, the display brightness of the OLED light-emitting unit 50 is increased and the IR drop of OLED is reduced consequently. Other pixel regions can refer to the introduction of the pixel region corresponding to the above OLED light-emitting unit A, and thus will not be repeated.

Figure 6:
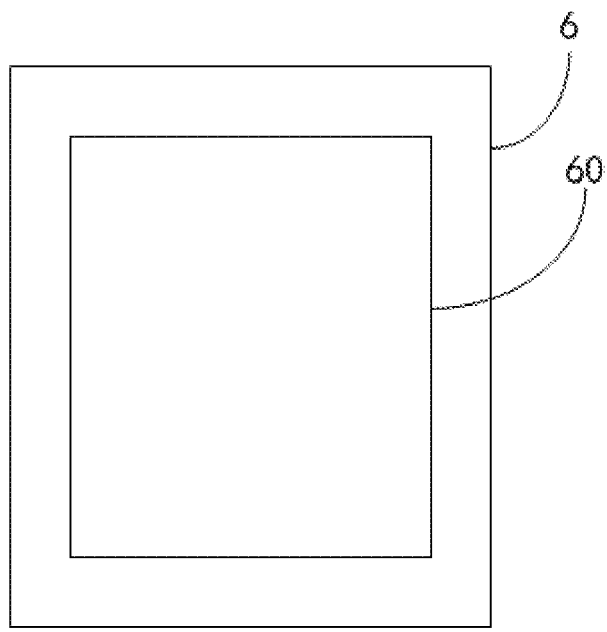
FIG. 6 is a structural schematic view of an embodiment of an OLED display apparatus according to the invention.

Referring to FIG. 6, which is a structural schematic view of an embodiment of an OLED display apparatus of the invention. The OLED display apparatus 6 includes an OLED display panel 60 like that in any one of the above embodiments, and thus will not be repeated.

In summary, different from the prior art, the OLED display panel proposed by the invention includes an array substrate and a cathode plate. The cathode plate is disposed overlying the array substrate and the cathode plate is disposed with multiple parallel cathode strips, each cathode strip is corresponding to one row of pixel regions on the array substrate and used as cathodes of the OLED light-emitting units in the row of pixel regions. The array substrate further is disposed with multiple cathode switching elements, the control terminal of each cathode switching element is electrically connected to one corresponding scan line, the first passage terminal thereof is connected to a low voltage DC power supply and the second passage terminal thereof is connected to one corresponding cathode strip. The OLED display panel proposed by the invention, when it is at work, the scan lines are progressively opened, when the scan line corresponding to the cathode strip is scanned, the corresponding cathode switching element is turned on to deliver the cathode voltage provided by the low voltage DC power supply to the corresponding cathode strip, so that the OLED light-emitting units in the row of pixel regions corresponding to the cathode strip can normally work. At a certain moment, when a certain one scan line is opened, only one cathode strip corresponding to the OLED light-emitting units in one row of pixel regions corresponding to the opened scan line can obtain the cathode voltage, such means can greatly reduce the resistance of cathode, reduce the IR drop caused by the resistance of cathode and improve display effect of OLED consequently.

The foregoing descriptions are merely embodiments of the invention and are not intended to limit the patent scope of the invention. Any equivalent structure or equivalent process transformation made according to the description and accompanying drawings of the invention, either directly or indirectly applied to other related technical field, should be included within the scope of the patent protection of the invention.

What is claimed is:

1. An OLED display panel, comprising
an array substrate, comprising a plurality of scan lines and a plurality of data lines, wherein the scan lines are mutually intersected with the data lines to divide the array substrate into a plurality of pixel regions, and each of the pixel regions has a corresponding OLED light-emitting unit disposed therein;
a cathode plate, being disposed corresponding to the array substrate and comprising a transparent substrate and a plurality of cathode strips arranged in parallel at a side of the transparent substrate facing toward the array substrate, wherein each of the cathode strips is corresponding to a row of pixel regions of the array substrate and used as cathodes of the OLED light-emitting units in the row of pixel regions;
wherein each of the pixel regions comprises a first switching element, a second switching element and the OLED light-emitting unit, wherein a control terminal of the first switching element is electrically connected to a corresponding one of the scan lines, and a first passage terminal of the first switching element is electrically connected to a corresponding one of the data lines; a control terminal of the second switching element is electrically connected to a second passage terminal of the first switching element, and a first passage terminal of the second switching element is connected to a high voltage direct current power supply; an anode of the OLED light-emitting unit is electrically connected to a second passage terminal of the second switching element, and a corresponding one of the cathode strips of the cathode plate is used as a cathode of the OLED light-emitting unit; the first switching element and the second switching element are thin film transistors;
wherein a plurality of cathode switching elements are disposed on the array substrate and the cathode switching elements are thin film transistors, a control terminal of each of the cathode switching elements is electrically connected to a corresponding one of the scan lines, a first passage terminal of the cathode switching element is connected to a low voltage direct current power supply, and a second passage terminal of the cathode switching element is connected to a corresponding one of the cathode strips; when the corresponding one of the scan lines is scanned, the corresponding cathode switching element is turned on to deliver a cathode voltage supplied by the low voltage direct current power supply to the corresponding one of the cathode strips and the OLED light-emitting units in the row of pixel regions corresponding to the cathode strip normally work;
wherein a plurality of electrically conductive connecting posts are disposed between the array substrate and the cathode plate; each of the cathode strips is connected to the second passage terminal of the corresponding one of the cathode switching elements by a corresponding one of the electrically conductive connecting posts.

2. The OLED display panel as claimed in claim 1, wherein a lengthwise direction of each of the cathode strips is the same as a direction of the scan line corresponding to the cathode strip; a width of each of the cathode strips is greater than or equal to a width of a row of OLED light-emitting units corresponding to the cathode strip.

3. The OLED display panel as claimed in claim 2, wherein the width of each of the cathode strips is smaller than a width of the row of pixel regions corresponding to the cathode strip.

4. The OLED display panel as claimed in claim 1, wherein a cathode signal line is disposed on the array substrate, and the first passage terminal of each of the cathode switching elements is connected to the low voltage direct current power supply by the cathode signal line.

5. The OLED display panel as claimed in claim 1, wherein the scan lines are progressively scanned; one of the scan lines is scanned at one moment, only one of the cathode strips corresponding to the scanned scan line receives a cathode voltage, and a cathode potential of the OLED light-emitting unit is supplied by the one of the cathode strips.

6. The OLED display panel as claimed in claim 1, wherein the second passage terminal of each of the cathode switching elements is a signal transfer probe point, and the signal transfer probe point is metal.

7. An OLED display panel, comprising
an array substrate, comprising a plurality of scan lines and a plurality of data lines, wherein the scan lines are intersected with the data lines to divide the array substrate into a plurality of pixel regions, each of the pixel regions has a corresponding OLED light-emitting unit disposed therein;
a cathode plate, being disposed corresponding to the array substrate and having a plurality of cathode strips in parallel disposed thereon, wherein each of the cathode strips is corresponding to a row of pixel regions of the array substrate and used as cathodes of OLED light-emitting units in the row of pixel regions;
wherein each of the pixel regions comprises a first switching element, a second switching element and the OLED light-emitting unit, wherein a control terminal of the first switching element is electrically connected to a corresponding one of the scan lines, and a first passage terminal of the first switching element is electrically connected to a corresponding one of the data lines; a control terminal of the second switching element is electrically connected to a second passage terminal of the first switching element, and a first passage terminal of the second switching element is connected to a high voltage direct current power supply; an anode of the OLED light-emitting unit is electrically connected to a second passage terminal of the second switching element, and a corresponding one of the cathode strips of the cathode plate is used as a cathode of the OLED light-emitting unit;
wherein a plurality of cathode switching elements are disposed on the array substrate, a control terminal of each of the cathode switching elements is electrically connected to a corresponding one of the scan lines, a first passage terminal of the cathode switching element is connected to a low voltage direct current power supply, and a second passage terminal of the cathode switching element is connected to a corresponding one of the cathode strips; when the corresponding one of the scan lines is scanned, the corresponding cathode switching element is turned on to deliver a cathode voltage provided by the low voltage direct current power supply to the corresponding cathode strip and OLED light-emitting units in the row of pixel regions corresponding to the cathode strip normally work;
wherein a plurality of electrically conductive connecting posts are disposed between the array substrate and the cathode plate, each of the cathode strips is connected to the second passage terminal of the corresponding one of the cathode switching elements by a corresponding one of the electrically conductive connecting posts.

8. The OLED display panel as claimed in claim 7, wherein a lengthwise direction of each of the cathode strips is the same as a direction of the scan line corresponding to the cathode strip.

9. The OLED display panel as claimed in claim 8, wherein a width of each of the cathode strips is greater than or equal to a width of the row of OLED light-emitting units corresponding to the cathode strip.

10. The OLED display panel as claimed in claim 7, wherein the cathode plate comprises a transparent substrate, and the cathode strips are disposed at a side of the transparent substrate facing toward the array substrate.

11. The OLED display panel as claimed in claim 7, wherein the first switching element and the second switching element are thin film transistors.

12. The OLED display panel as claimed in claim 7, wherein the cathode switching elements are thin film transistors.

13. The OLED display panel as claimed in claim 7, wherein a cathode signal line is disposed on the array substrate, and the first passage terminal of each of the cathode switching elements is connected to the low voltage direct current power supply by the cathode signal line.

14. An OLED display apparatus, wherein the OLED display apparatus comprises an OLED display panel, the OLED display panel comprising an array substrate, comprising a plurality of scan lines and a plurality of data lines, wherein the scan lines are intersected with the data lines to divide the array substrate into a plurality of pixel regions, each of the pixel regions has a corresponding OLED light-emitting unit disposed therein;

a cathode plate, being disposed corresponding to the array substrate and having a plurality of cathode strips in parallel disposed thereon, wherein each of the cathode strips is corresponding to a row of pixel regions of the array substrate and used as cathodes of OLED light-emitting units in the row of pixel regions;

wherein each of the pixel regions comprises a first switching element, a second switching element and the OLED light-emitting unit, wherein a control terminal of the first switching element is electrically connected to a corresponding one of the scan lines, and a first passage terminal of the first switching element is electrically connected to a corresponding one of the data lines; a control terminal of the second switching element is electrically connected to a second passage terminal of the first switching element, and a first passage terminal of the second switching element is connected to a high voltage direct current power supply; an anode of the OLED light-emitting unit is electrically connected to a second passage terminal of the second switching element, and a corresponding one of the cathode strips of the cathode plate is used as a cathode of the OLED light-emitting unit; the first switching element and the second switching element are thin film transistors;

wherein a plurality of cathode switching elements are disposed on the array substrate, a control terminal of each of the cathode switching elements is electrically connected to a corresponding one of the scan lines, a first passage terminal of the cathode switching element is connected to a low voltage direct current power supply, and a second passage terminal of the cathode switching element is connected to a corresponding one of the cathode strips; when the corresponding one of the scan lines is scanned, the corresponding cathode switching element is turned on to deliver a cathode voltage provided by the low voltage direct current power supply to the corresponding cathode strip and OLED light-emitting units in the row of pixel regions corresponding to the cathode strip normally work;

wherein a plurality of electrically conductive connecting posts are disposed between the array substrate and the cathode plate, and each of the cathode strips is connected to the second passage terminal of the corresponding one cathode switching element by a corresponding one of the electrically conductive connecting posts.

15. The OLED display apparatus as claimed in claim 14, wherein a lengthwise direction of each of the cathode strips is the same as a direction of the scan line corresponding to the cathode strip; a width of each of the cathode strips is greater than or equal to a width of the row of OLED light-emitting units corresponding to the cathode strip.

16. The OLED display apparatus as claimed in claim 14, wherein the cathode plate comprises a transparent substrate, and the cathode strips are disposed at a side of the transparent substrate facing toward the array substrate.

17. The OLED display apparatus as claimed in claim 14, wherein a cathode signal line is disposed on the array substrate, and the first passage terminal of the each of the cathode switching elements is connected to the low voltage direct current power supply by the cathode signal line.

* * * * *